United States Patent
Kitani

(10) Patent No.: US 6,784,409 B2
(45) Date of Patent: Aug. 31, 2004

(54) ELECTRONIC DEVICE WITH ENCAPSULANT OF PHOTO-SET RESIN AND PRODUCTION PROCESS OF SAME

(75) Inventor: Masashi Kitani, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 374 days.

(21) Appl. No.: 09/813,846

(22) Filed: Mar. 22, 2001

(65) Prior Publication Data

US 2001/0048064 A1 Dec. 6, 2001

(30) Foreign Application Priority Data

Mar. 28, 2000 (JP) ........................................ 2000-089209

(51) Int. Cl.⁷ .................. H01L 21/60; H01L 27/14; H04N 5/335; G03B 19/00
(52) U.S. Cl. ................. 250/208.1; 250/237 R; 257/434; 257/435; 257/676; 257/680; 257/E23.01; 438/72
(58) Field of Search .................. 250/208.1–208.3, 250/214.1, 216, 237 R, 239; 257/81, 433–437, 659, 660, 676, 678, 680; 438/26, 28, 64, 69, 72

(56) References Cited

U.S. PATENT DOCUMENTS

| 5,079,190 | A |   | 1/1992 | Mihara ........................ 437/220 |
| 5,081,347 | A |   | 1/1992 | Matsumoto ............... 250/211 J |
| 5,302,818 | A | * | 4/1994 | Pezant ......................... 250/216 |
| 5,506,401 | A |   | 4/1996 | Segawa et al. .......... 250/208.1 |
| 5,786,589 | A |   | 7/1998 | Segawa et al. .......... 250/208.1 |
| 6,075,237 | A | * | 6/2000 | Ciccarelli ................. 250/208.1 |

FOREIGN PATENT DOCUMENTS

JP  7-99214  4/1995

* cited by examiner

Primary Examiner—N. Le
Assistant Examiner—Darrell Kinder
(74) Attorney, Agent, or Firm—Fitzpatrick, Cella, Harper & Scinto

(57) ABSTRACT

An electronic device is described which comprises a functional element chip having a photofunctional element formed thereon, a wiring member electrically connected to a terminal of the functional element chip, and an encapsulant for fixing the functional element chip and the wiring member, wherein a light blocking member with an opening portion is provided on a front face side of the wiring member, and wherein an end of the opening portion is located more inside than an inner end of the wiring member.

8 Claims, 11 Drawing Sheets

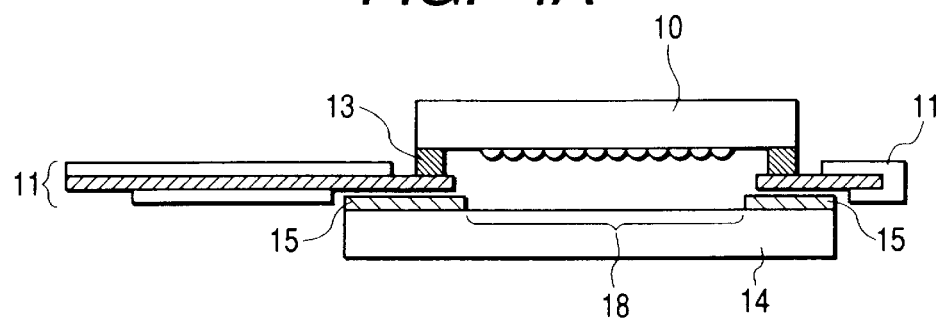
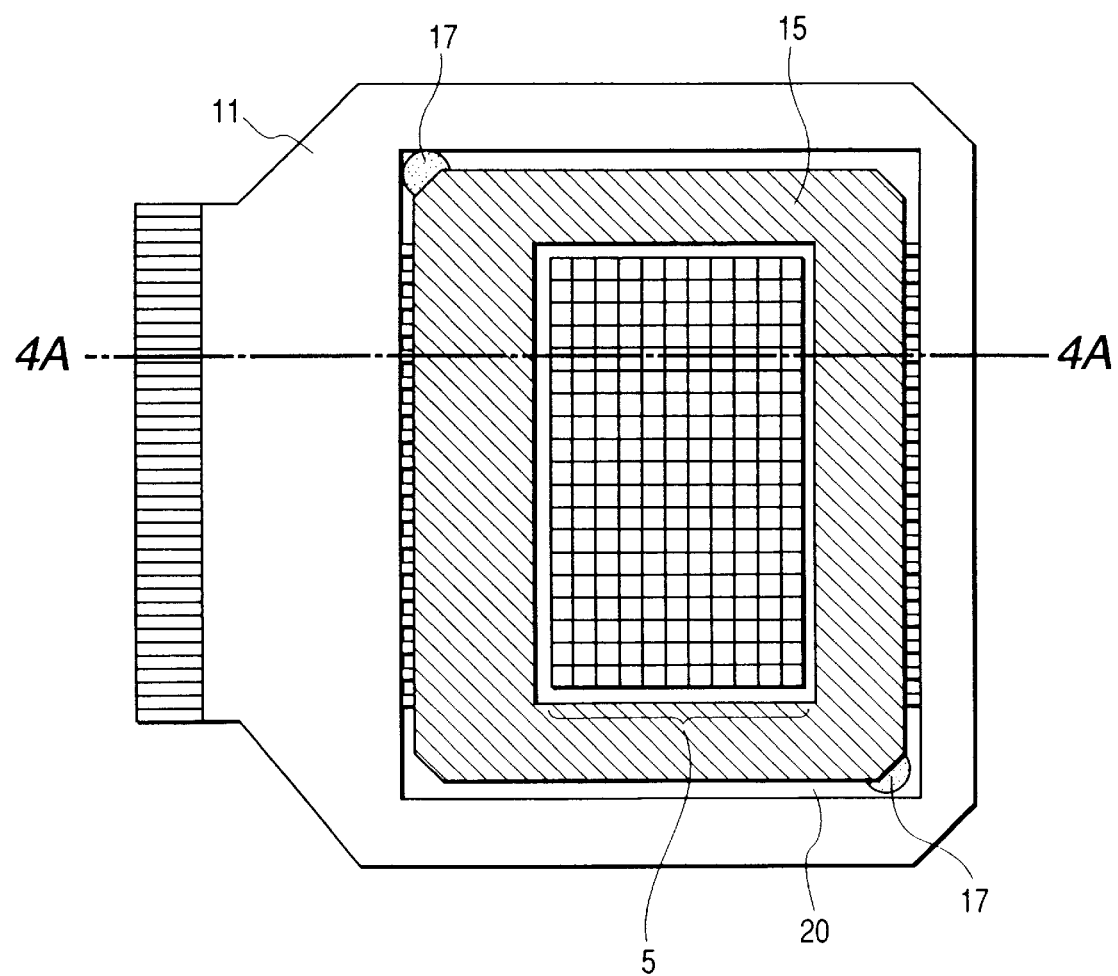

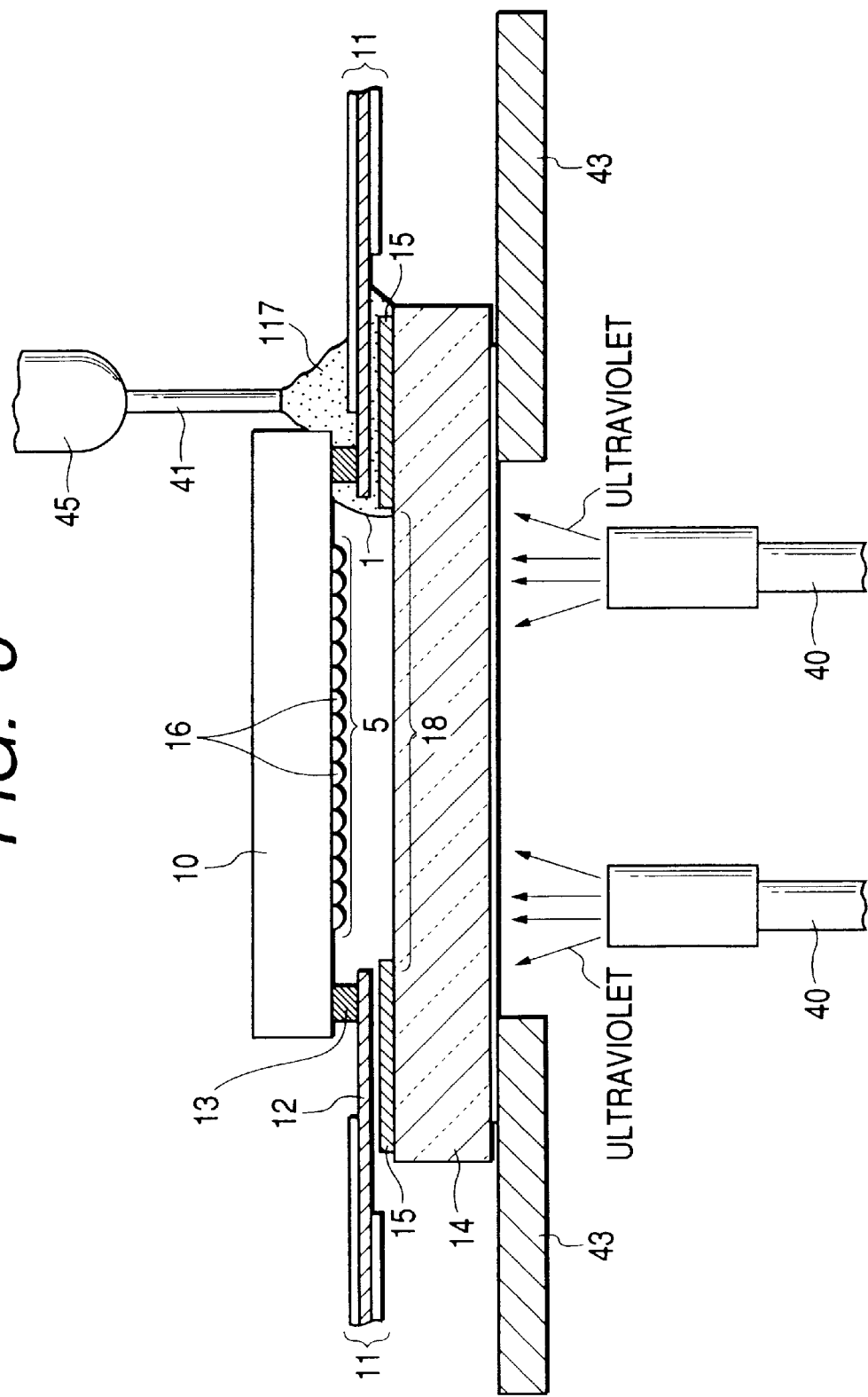

ELECTRONIC DEVICE WITH ENCAPSULANT OF PHOTO-SET RESIN AND PRODUCTION PROCESS OF SAME

BACKGROUND OF THE INVENTION

1. Field of the Invention

The invention relates to an electronic device such as an image pickup device, a light emitting device, or a display device, and a production process of the same. Specifically, the invention relates to an electronic device comprising terminals of a functional element chip, wiring members electrically connected to the terminals, and an encapsulant to fix the functional element chip and the wiring members, and a production process of the same.

2. Related Background Art

As a type of electronic devices, devices are known, which can convert optical information to an electric signal, can convert an electric signal to optical information, can effect light emission or optical modulation with an electric signal, or can change an optical path with an electric signal. As such devices, devices that have a photofunctional element are known. As the photofunctional element, there are known light receiving elements, light emitting elements, DMD (digital micromirror device), and so on.

As an example, an image pickup device having a light-receiving-element array as an electronic device will be described below. Image pickup devices are often incorporated in image input equipments such as video cameras, digital still cameras, or the like. In production of such an image pickup device, after integrated circuits are fabricated on a semiconductor substrate such as a silicon wafer by integrating photodiodes as light receiving elements and CCD, CMOS or the like as drive/read circuits, color filters and micro lenses are formed above an imaging area (effective pixel region) with an acryl material.

Subsequently, the silicon wafer having the integrated circuits, color filters and micro lenses formed thereon is subjected to dicing into chips, the chips are then housed in ceramic packages or the like, and electric connection is then made between the chip and leads by wire bonding or the like. After that, a cap of a glass plate is attached over the package to protect the chip from the atmosphere.

Recently, as miniaturization of image input equipments such as digital cameras has been made, there has been a need to develop smaller and thinner image pickup devices. Approaches to miniaturize image pickup devices are described, for example in Japanese Patent Application Laid-Open No. 7-99214 and U.S. Pat. No. 5,786,589.

FIG. 10 is a sectional view of a prior art image pickup device. The image pickup device shown in FIG. 10 has a glass cap 14, a TAB (tape-automated bonding) tape 11, and an image pickup element chip. Reference numeral 2 denotes a part of a surface of encapsulant 7. Reference numeral 19 denotes a space surrounded by the cap 14 which is a light transmissive protective member, the encapsulant 7 and the semiconductor element chip 10. The space contains air, an inert gas or the like. First, the glass cap 14 is adhered to the TAB tape 11 having a beam lead 12, with an adhesive layer 30 therebetween. A bump 13 is formed on an image pickup element chip to having an effective pixel region 5 image pickup elements (not shown) and microlenses 16 formed thereon, and an anisotropic conductive adhesive 7 is applied to the bump 13 and its periphery by a dispenser or the like. After the TAB tape 11 adhered to the glass cap 14 with the adhesive layer 30 is aligned with the chip 10, the bump 13 and the TAB tape 11 are thermocompression bonded to each other. Thus, the image pickup device shown in FIG. 10 is obtained.

(Technical Problem 1)

However, since the glass cap 14, the adhesive layer 30, and the insulating film 4 and so on are light transmittable, a light incident on a front face of the beam lead 12 made of a lustrous metal may reflect at the face, and the reflected light may further reflect at the respective interfaces to stray into the effective pixel region. When there is such a stray light, the quality of an obtained image is degraded. Further, in display device such as a DMD, a light reflected from a beam lead may also lower the displaying quality.

(Technical Problem 2)

Furthermore, when the TAB tape 11 adhered to the glass cap 14 with the adhesive layer 30 is thermocompression bonded after the alignment, in order to prevent the anisotropic conductive adhesive 7 from intruding into the effective pixel region 5 during the thermocompression bonding, it is attempted to control the amount of application.

However, with the prior art technique, it is difficult in practice to precisely control the application amount of the anisotropical conductive adhesive 7 although attempt is made to prevent the anisotropical conductive adhesive 7 from intruding into the effective pixel region 5. In fact, the inside protrusion of the anisotropical conductive adhesive 7 toward the effective pixel region occurs, as shown in FIG. 11.

Since the intrusion into the effective pixel region 5 is fatal, when the amount of the anisotropical conductive adhesive is reduced to prevent the inside protrusion, both the electrical connection and mechanical bonding strength become insufficient, which may result in opening of the connection portion, break in the beam lead, breakage of the TAB film, or the like, thus lowering the reliability and the production yield of the image pickup device.

SUMMARY OF THE INVENTION

It is, therefore, an object of the invention to provide an electronic device that can solve at least the above mentioned technical problem 1 and can suppress the disadvantage due to light reflected from a beam lead, and a production process of the same.

Another object of the invention is to provide an electronic device that can solve at least the above mentioned technical problem 2, has improved reliability, and can be produced at a low cost, and a production process of the same.

Still another object of the invention is to provide an electronic device that can solve the above mentioned technical problems 1 and 2, can suppress the disadvantage due to light reflected from a beam lead, and is highly reliable and inexpensive, and a production process of the same.

A first aspect of the invention is an electronic device comprising a functional element chip having a photofunctional element formed thereon, a wiring member electrically connected to a terminal of the functional element chip, and an encapsulant for fixing the functional element chip and the wiring member, wherein a light blocking member with an opening portion is provided on a front face side of the wiring member, and wherein an end of the opening portion is located more inside than an inner end of the wiring member.

A second aspect of the invention is an electronic device comprising a semiconductor chip having an optical semiconductor element formed thereon, a wiring member electrically connected to a terminal of the semiconductor chip, an encapsulant for fixing the semiconductor chip and the wiring member, and a light transmissive protective member, wherein a light blocking member with an opening portion is provided between a front face of the wiring member and a rear face of the protective member, wherein an end of the opening portion is located more inside than an inner end of the wiring member, and wherein the encapsulant is a photo-set resin, and the end of the opening portion and an inner end of the encapsulant align.

A third aspect of the invention is a process of producing an electronic device comprising a functional element chip with a terminal, a wiring member electrically connected to the terminal, an encapsulant for fixing the functional element chip and the wiring member, and a light transmissive protective member, the process comprising the steps of:

disposing a light blocking member with an opening portion between a front face of the wiring member and a rear face of the protective member such that an end of the opening portion is located more inside than an inner end of the wiring member;

providing a photo-setting resin for forming the encapsulant onto the periphery of a connecting portion between the wiring member and the terminal of the functional element chip; and irradiating a light from the side of a front face of the protective member through the opening portion of the light blocking member to set at least a part of the photo-setting resin.

A forth aspect of the invention is a process of producing an electronic device comprising a first substrate, a second, light transmissive substrate disposed apart from the first substrate, and an encapsulant for fixing the periphery of the first and the second substrates so as to fill a space between the first and the second substrates, comprising the steps of:

disposing a light blocking member with an opening portion on a rear face of the periphery of the second substrate;

disposing a photo-setting resin for forming the encapsulant on the periphery of the first and the second substrates; and irradiating a light from the side of a front face of the second substrate through the opening portion of the light blocking member to set at least a part of the photo-setting resin.

BRIEF DESCRIPTION OF THE DRAWINGS

FIGS. 4A and 4B are production step diagram of a solid state image pickup device according to an embodiment of the invention;

FIG. 6 is a production step diagram of a solid state image pickup device according to an embodiment of the invention;

DETAILED DESCRIPTION OF THE PREFERRED EMBODIMENTS

Preferred embodiments according to the invention will be described with reference to the drawings hereafter.

Figure 1:
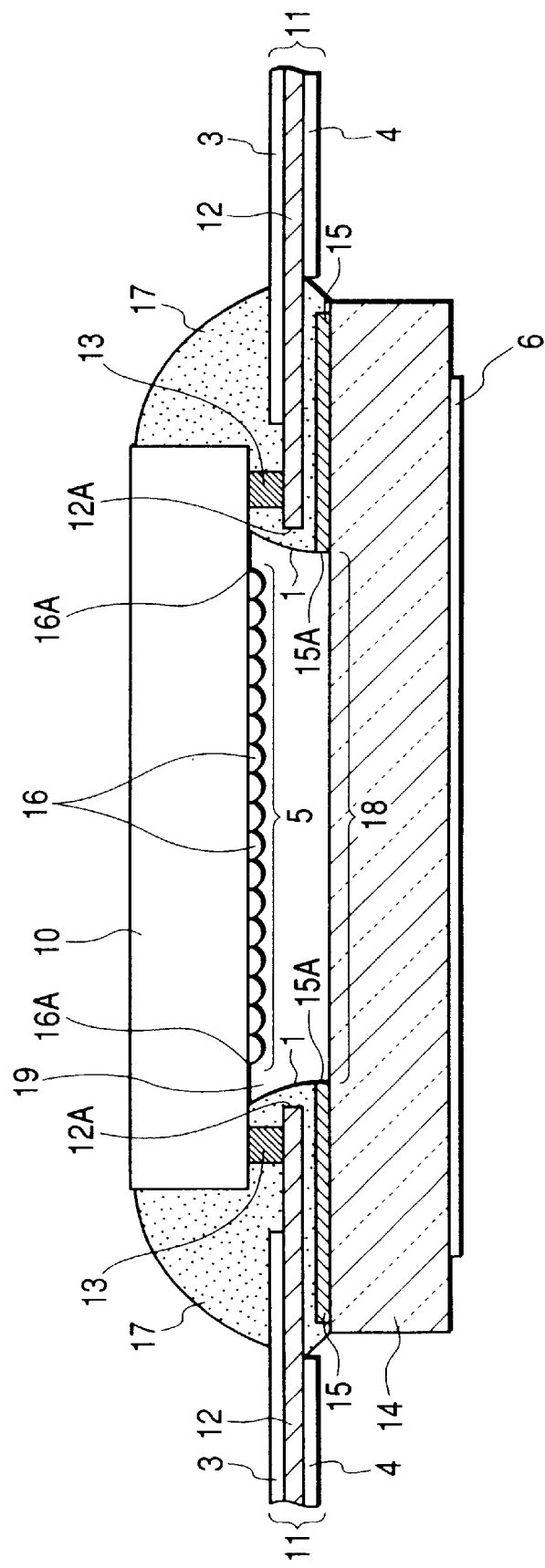
FIG. 1 is a schematic sectional view of a solid state image pickup device as an electronic device according to an embodiment of the invention.

FIG. 1 is a sectional view of an electronic device (part) according to an embodiment of the invention. In this embodiment, an example of an image pickup device will be described as an electronic part.

The electronic part has a functional element chip (a first substrate) 10 having functional elements formed thereon, a wiring member 11 electrically connected to terminals 13 of the functional element chip 10, and an encapsulant 17 for fixing the functional element chip 10 and the wiring member 11. The device is characterized in that a light blocking member 15 with an opening portion 18 is provided at a location nearer the front face of the device (i.e., the lower end of the device of the view shown in FIG. 1) than the wiring member 11, and an end 15A of the opening portion 18 is located more inside than an inner end 12A of the wiring member 11.

Specifically describing hereafter for FIG. 1, the semiconductor chip 10 as a functional element chip is an image pickup element chip having a plurality of photoelectric conversion elements and micro lenses 16 formed thereon, and is provided with bumps 13 of gold or the like as terminals. Reference numeral 11 denotes a TAB (tape-automated bonding) tape wherein a conductive beam lead 12 of gold-plated nickel alloy or the like is provided on an insulating tape film 3 mainly comprised of polyimide or the like. Reference numeral 4 denotes an insulating film.

A cap 14 as a light transmissive protective member (a second substrate) is made of glass or resin in a plate form. Reference numeral 15 denotes a light blocking member (a light blocking mask) made of a light-absorptive material such as a black epoxy resin formed on the rear face of the periphery of the cap 14. Reference numeral 18 denotes an opening portion of the light blocking member mask 15.

Since the light blocking mask 15 is thus provided so as to cover the front face of the portion where the metal beam leads 12 are exposed for electrical connection, it is possible to suppress the light reflected at the front faces of the beam leads 12 from forming a stray light to be incident on an effective pixel region 5.

In FIG. 1, reference numeral 17 denotes an encapsulant made of a photo-setting resin that sets upon irradiation with ultraviolet or the like, and fixes the bumps 13 provided on the chip 10 and the TAB tape 11 by adhesion. This also improves moisture resistance of the electronic part. Reference numeral 19 denotes a space surrounded by the cap 14, the encapsulant 17 and the chip 10. The space contains air, an inert gas or the like.

The area of the opening portion 18 of the light blocking mask 15 is such that necessary light from an imaging object (object) is incident on the effective pixel region 5 of the solid state image pickup element chip 10, for example, as described later, such that when the chip 10 and the light blocking mask are aligned with each other, the end 15A of the opening portion 18 (i.e., the inner end of the light blocking mask) is located outside by about 0.3 μm of the outer end 16A of the effective pixel region 5.

Further, the encapsulant 17 may be cured resin which is formed by setting a well-known photo-setting resin selected from epoxy resin, phenol resin, acrylic resin, urethane resin or the like. More preferably, it is preferred that the encapsulant is formed of a thermo-photo-setting adhesive that sets by at least one of light and heat. Specifically, an ultraviolet-setting epoxy resin is preferably used. Further, an encapsulant with anisotropic conductivity may also be used.

Figure 2A:
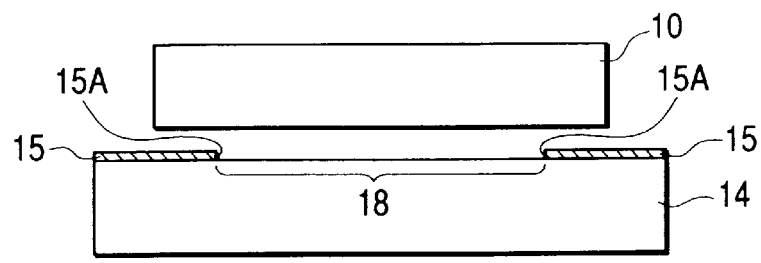
FIGS. 2A, 2B and 2C are production step diagrams for explaining the production process of an electronic device according to the invention.
Figure 2B:
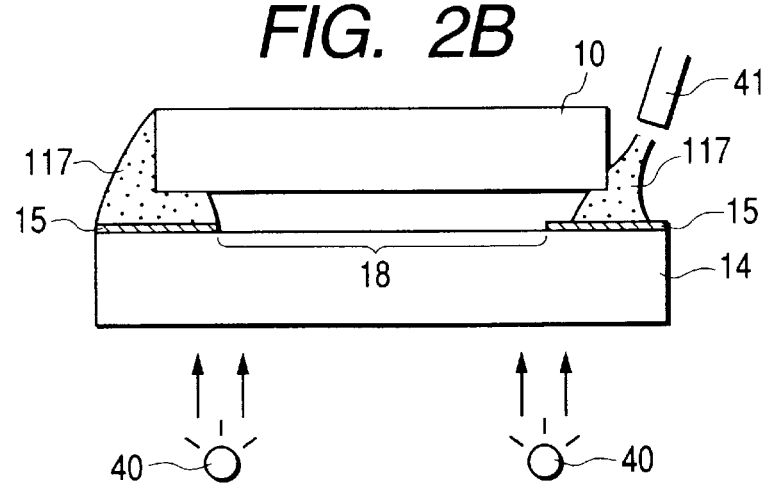
Figure 2C:
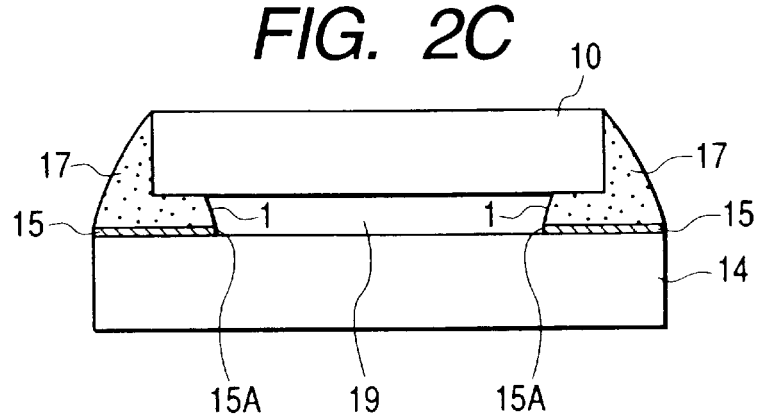

FIGS. 2A to 2C are schematic sectional views for explaining an outline of a production process of an electronic part according to the invention.

First, a first substrate such as the functional element chip 10, and a second substrate such as the cap 14 of glass or resin are prepared. The light blocking member 15 such as of a light-absorptive material is then formed on the rear face of the periphery of the light transmissive second substrate 14.

As shown in FIG. 2A, the first substrate 10 and the second substrate 14 are placed apart from each other. Reference numeral 15A denotes the inner end of the light blocking member 15.

As shown in FIG. 2B, a photo-setting resin 117 for forming the encapsulant 17 to fix the periphery of the first substrate 10 and the second substrate 14 is provided on the periphery of the first substrate 10 and the second substrate 14 from a nozzle 41 of a dispenser so as to fill the space between the first substrate 10 and the second substrate 14.

As shown in FIG. 2B, a light such as ultraviolet is then irradiated from the front face of the second substrate 14 through the opening portion 18 of the light blocking member 15 to set at least a part of the photo-setting resin 117. While the photo-setting resin 117 flows between the first and second substrates, it will not flow into the area inside the inner end 15A of the light blocking member 15 since upon reaching the inner end 15A of the light blocking member 15 it starts to set by the light from light sources 40. That is, the flow of the resin will stop of itself at the inner end 15, so that the an inner end 1 of the encapsulant 17 will be self-aligned with (or be flush of itself with) the inner end 15A of the light blocking member 15.

After that, by optionally irradiating a light from the side of the rear or side face of the second substrate 14, the photo-setting resin 117 will set completely to form the encapsulant 17 as shown in FIG. 2C, thereby firmly fixing the first and second substrates. When a thermo-photo-setting resin capable of setting also by heat is used as the photo-setting resin, the resin 117 can be set completely by heating the resin 117 after the light irradiation from the front face side.

Referring to FIG. 1 again, the inner end 1 of the encapsulant 17 made of the photo-set resin 117 is flush with the inner end 15A of the light blocking member 15, and the inner end 12A of the lead 12 is located outside the inner end 1 of the encapsulant 17 (i.e., in the encapsulant 17). While the inner end 1 of the encapsulant 17 is an inclined shape in this example, the shape of the inner end 1 in the invention is not limited to the inclined shape since the shape of the inner end depends on the wettability of the photo-setting resin to the surface of the chip 10, the angle of incidence of ultraviolet, and the degree of reflectance.

As described above, the electronic part according to the embodiment of the invention is characterized in that the light blocking member 15 with the opening portion 18 is provided between the front face of the wiring member 11 and the rear face of the protective member 14; the end 15A of the opening portion 18 is located more inside than the inner end 12A of the wiring member 11; the encapsulant 17 is formed by setting the photo-setting resin 117; and the end 15A of the opening portion 18 and the inner end of the encapsulant 17 are flush with each other.

This makes it possible to sufficiently increase the electrical connection and mechanical bonding strength and to prevent occurrence of opening of connecting portions, break of beam leads, breakage of TAB films, and so on. Thus, it is possible to improve the reliability and production yield of the image pickup device.

A production process of an electronic part according to another embodiment of the invention will be described below with reference to FIGS. 3A to 6.

An example of the same solid state image pickup device as shown in FIG. 1 will be described in detail, hereafter.

First, image pickup elements are fabricated on a semiconductor substrate, and color filters (not shown) and the micro lenses 16 are formed thereon to prepare the solid state image pickup element chip (functional chip) 10 and the bumps 13 are formed thereon.

Figure 3A:
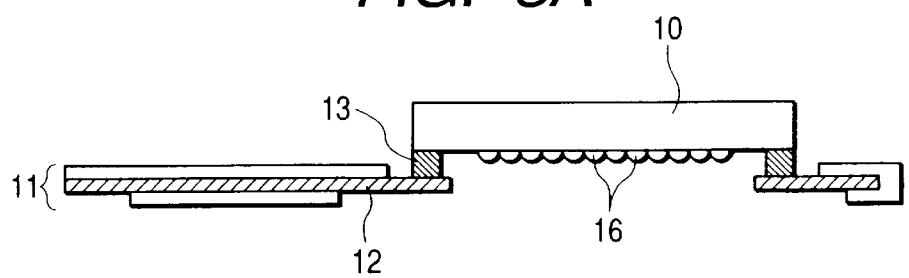
FIGS. 3A and 3B are production step diagrams of a solid state image pickup device according to an embodiment of the invention.
Figure 3B:
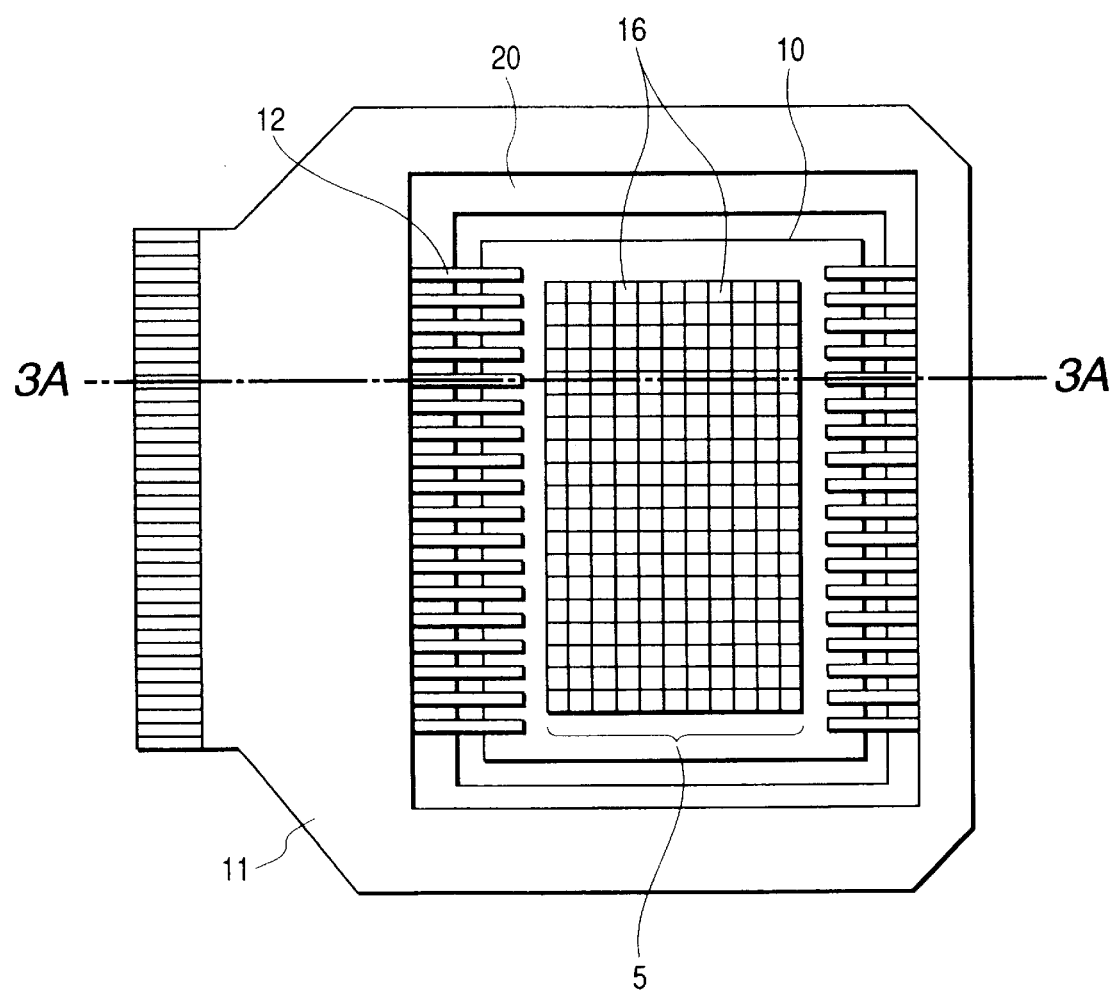
Figure 5A:
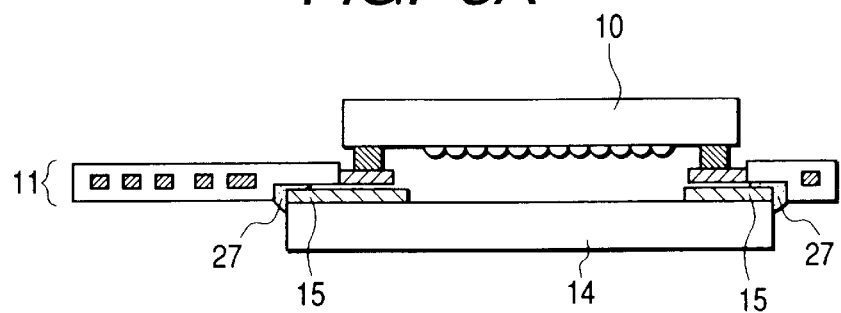
FIGS. 5A and 5B are production step diagrams of a solid state image pickup device according to an embodiment of the invention.
Figure 5B:
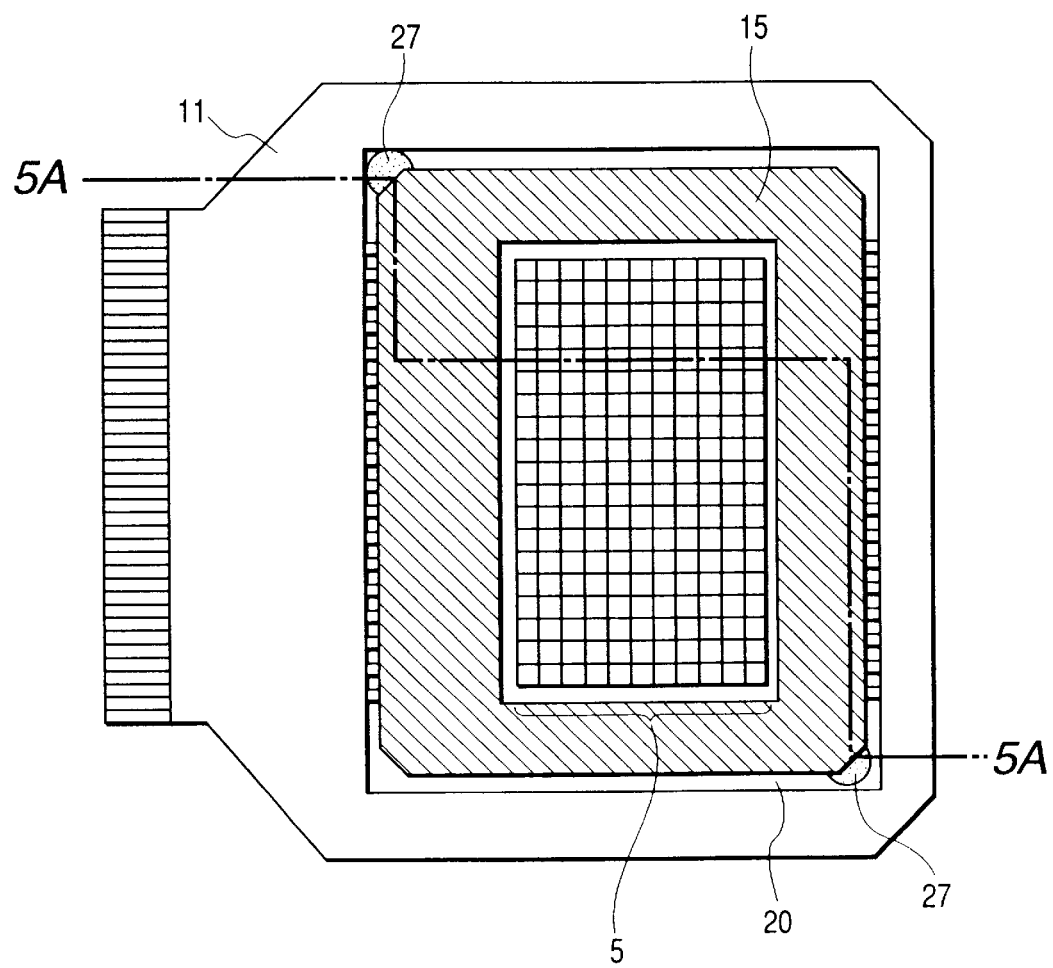

Then, the bumps 13 and the beam leads 12 of the TAB tape 11 are electrically connected to each other in a device hole 20 (see FIGS. 3A and 3B).

Specifically, the bumps 13 are formed on electrode pads of the solid state image pickup element chip 10, and each pair of the beam lead 12 and the bump 13 are thermo-compression bonded to each other by ultrasonic and heat, or the like to be connected to each other at a single point. When the connection is performed, alignment is conducted such that the center of the effective pixel region 5 is in conformity with the center of the device hole 20.

The device hole 20 is formed so as to be smaller than the cap 14 as a protective member and larger than the solid state image pickup element chip 10. This is to attain stable, temporal fixation of the light blocking mask 15 and the side of the beam leads 12 to which the bumps 13 are not connected, as described below. Further, the bumps and the leads may also be connected to each other by use of an anisotropic conductive adhesive.

Subsequently, on a surface of the cap 14 prepared by cutting a transparent glass plate (not shown) and chamfering the cut surfaces, the light blocking mask 15 of about 30 μm in thickness is printed. The cap 14 and the chip 10 are placed in opposition to each other at a predetermined distance such that the light blocking mask 15 is a rear face of the cap, and the opening portion 18 formed in the light blocking mask 15 is then aligned with the effective pixel region 5 (See FIGS. 4A and 4B).

In such state, for example, the light blocking mask 15 and the front face of the beam leads 12 where the bumps 13 are not connected, are temporarily fixed together with a temporary fixing sealant 27. The temporary fixing sealant 27 may be provided only at a part of the corners of the chip 10, as shown FIGS. 5A and 5B.

The sealant 27 has not been subjected to irradiation with a light such as ultraviolet and does not set yet. The thickness of the light blocking mask 15 is not limited to 30 μm as long as it is such a thickness as to bar passage of ultraviolet. The mask 15 may be also, for example a seal-like member made of a resin adhered to the TAB tape 11.

Next, as shown in FIG. 6, an external mask 43 is attached to the side of the cap 14 where the light blocking mask 15 is not formed. The external mask 43 has an opening portion that is smaller than the cap 14 and larger than the opening portion 18 of the light blocking mask 15. The sealing resin 117 is then provided onto the periphery of the connecting portion between the chip 10 and the TAB tape 11 through a needle tip 41 of the dispenser 45 with, for example, the front face of the cap 14 being directed downward, and is applied thereon such that the TAB tape 11 and the solid state image pickup element chip 10 with the bumps 13 formed thereon are adhered and fixed to each other.

Subsequently, ultraviolet is irradiated by light sources 40 such as optical fibers, from the lower side, i.e., from the side where the light blocking mask 15 is not formed of the cap 14. At this time, the ultraviolet is blocked by the external mask 43 and the light blocking mask 15 and is not irradiated directly to the applied sealing resin 117.

On the other hand, the applied sealing resin 117 penetrates a space between the image pickup element chip 10 and the TAB tape 11, between the beam leads and the light blocking member, and between the beam leads by the capillary action. The sealing resin 117 may also be applied under irradiation with ultraviolet.

After that, when the penetrating sealing resin 117 reaches the opening portion 18 side end of the light blocking mask 1, the sealing resin 117 is exposed to the ultraviolet to start a setting reaction. The viscosity of the sealing resin 117 is then increased, so that the resin cannot penetrate the area on the effective pixel region 5 side any longer. Therefore, the application amount of the sealing resin 117 can be increased substantially to attain firm adhesion between the solid state image pickup element chip 10 and the TAB tape 11.

After that, the sealing resin 117 is heated by a heating means (not shown) to a temperature lower than the resistive temperature of the micro lenses, for example 100° C. to 150° C. As a result, the sealing resin sets to form the encapsulant 17 as shown FIG. 1. Thus, the TAB tape 11, the bumps 13 and the solid state image pickup element chip 10 are fixed, and the cap 14 with the light blocking mask 15 temporarily fixed thereto is also firmly adhered and fixed.

Incidentally, the sealing resin 117 may also be subject to ultraviolet irradiation from the upper side of the cap 14 of the view shown in FIG. 6 prior to heating the resin, thereby setting the resing 117 on the upper side of the TAB tape 11 to a certain extent. Then, the external mask 43 is detached from the cap 14 to complete the production of the solid state image pickup device such as shown in FIG. 1.

Figure 7A:
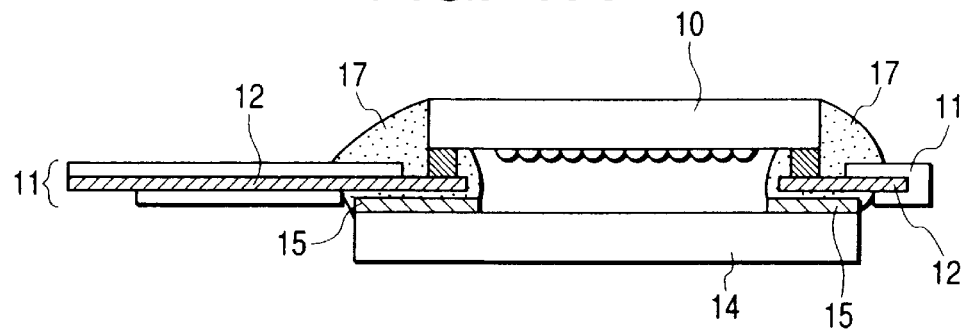
FIGS. 7A and 7B are schematic views of a solid state image pickup device according to another embodiment of the invention.
Figure 7B:
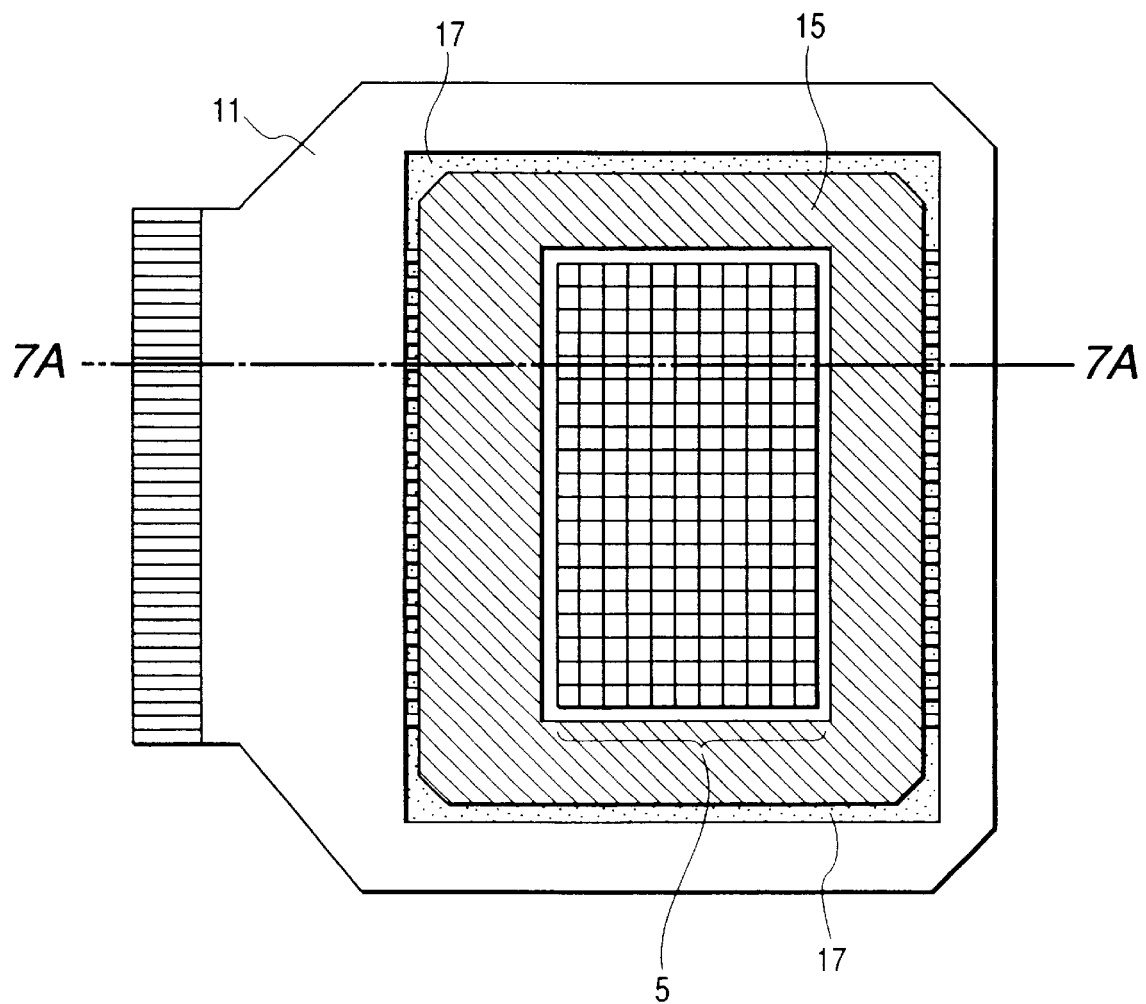

The encapsulant 17 may also be formed, as shown in FIGS. 7A and 7B, such that it covers the beam leads 12 of the TAB film to prevent exposure of the beam leads 12 in the vicinity of the connecting portion, and surrounds the entire periphery of the chip 10. In this case, the TAB film, and the chip and the protective member are fixed to each other still more firmly.

Figure 8A:
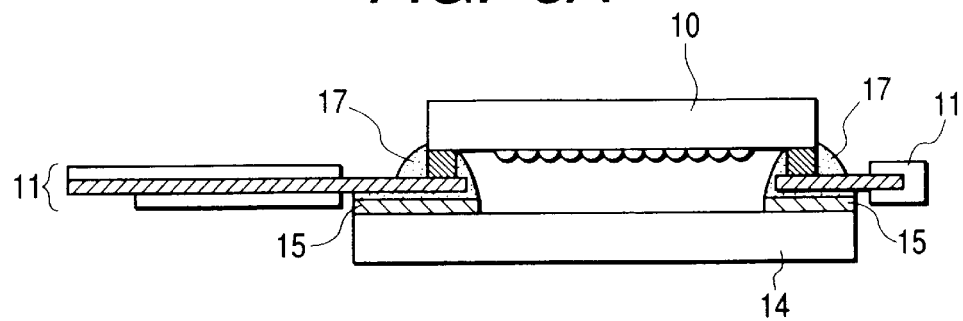
FIGS. 8A and 8B are schematic views of a solid state image pickup device according to yet another embodiment of the invention.
Figure 8B:
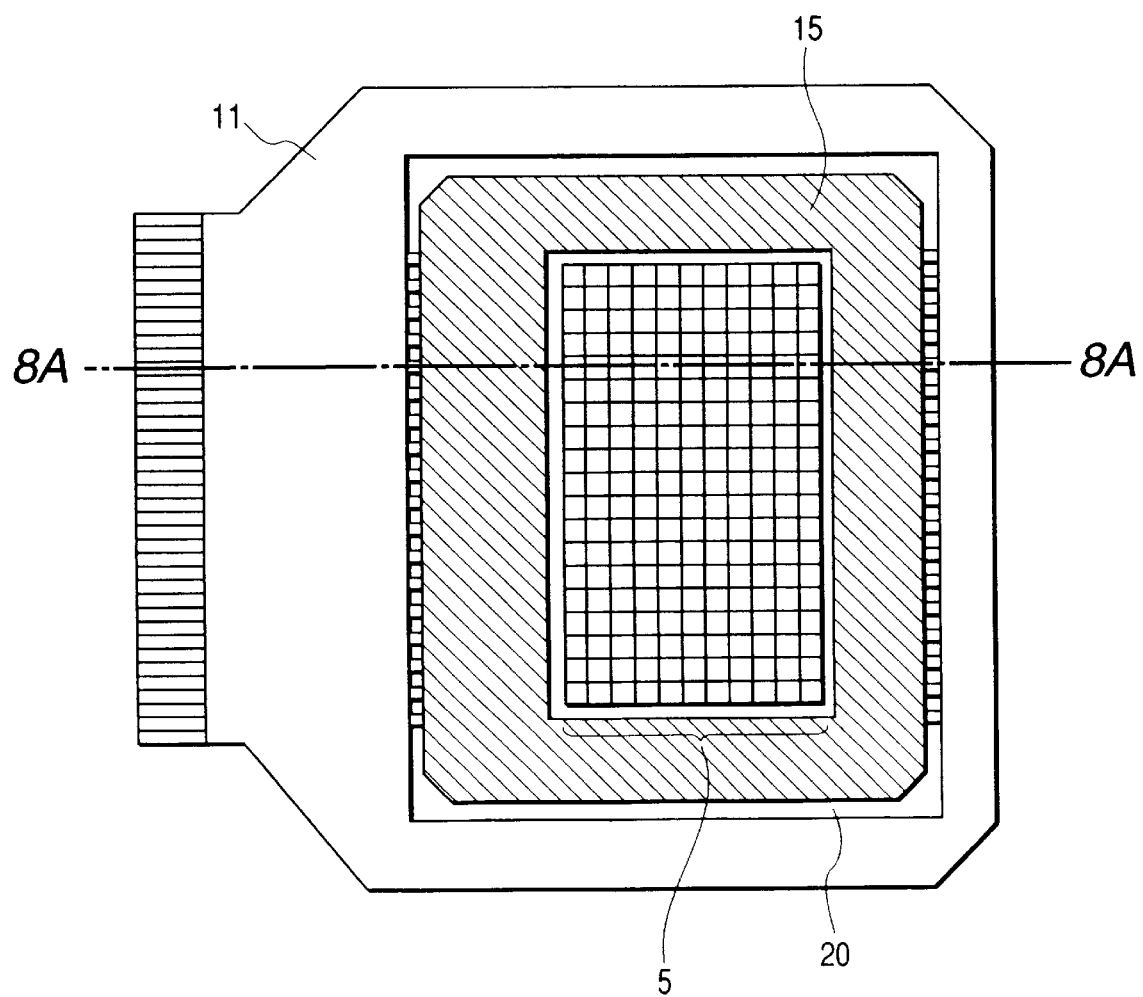

Alternatively, the encapsulant 17 may also be formed, as shown in FIGS. 8A and 8B, such that it surrounds the entire periphery of the chip 10 with a part of the beam leads 12 of the TAB film being exposed in the vicinity of the connecting portion. In this case, the flexibility is increased at the portion where the beam leads 12 are exposed. Selection of one of the configurations of FIGS. 7A and 7B, and FIGS. 8A and 8B depends on how the electronic part is mounted in an equipment body.

Further, the encapsulant 17 may be provided so as to surround the entire periphery of the chip 10, or provided discretely at a plurality of locations along the periphery of the chip.

As described above, the production process of an electronic part according to this embodiment is characterized in including the step of disposing the light blocking member 15 with the opening portion 18 between the front face of the wiring member 11 and the rear face of the protective member 14 such that the end 15A of the opening portion 18 is located inside the inner end 12A of the wiring member 11; the step of providing the photo-setting resin 117 for forming the encapsulant 17 on the periphery of the connecting portion between the wiring member 11 and the terminals 13 of the functional element chip 10; and the step of irradiating a light from the side of the front face of the protective member 14 through the opening portion 18 of the light blocking member 15 to set at least a part of the photo-setting resin 117.

This makes it possible to provide an electronic part that can suppress the disadvantage due to reflected light from beam leads, and is highly reliable and inexpensive, and a production process of the same.

As the photofunctional elements used in the invention, there may be included light receiving semiconductor elements such as photo-diodes, light emitting semiconductor elements such as LED, elements such as micromirrors, and so on. Therefore, as the functional element chip, a light emitting element chip such as LED or FED, or an optical modulating element chip such as DMD may also be used, in addition to the solid state image pickup element chip.

Figure 9:
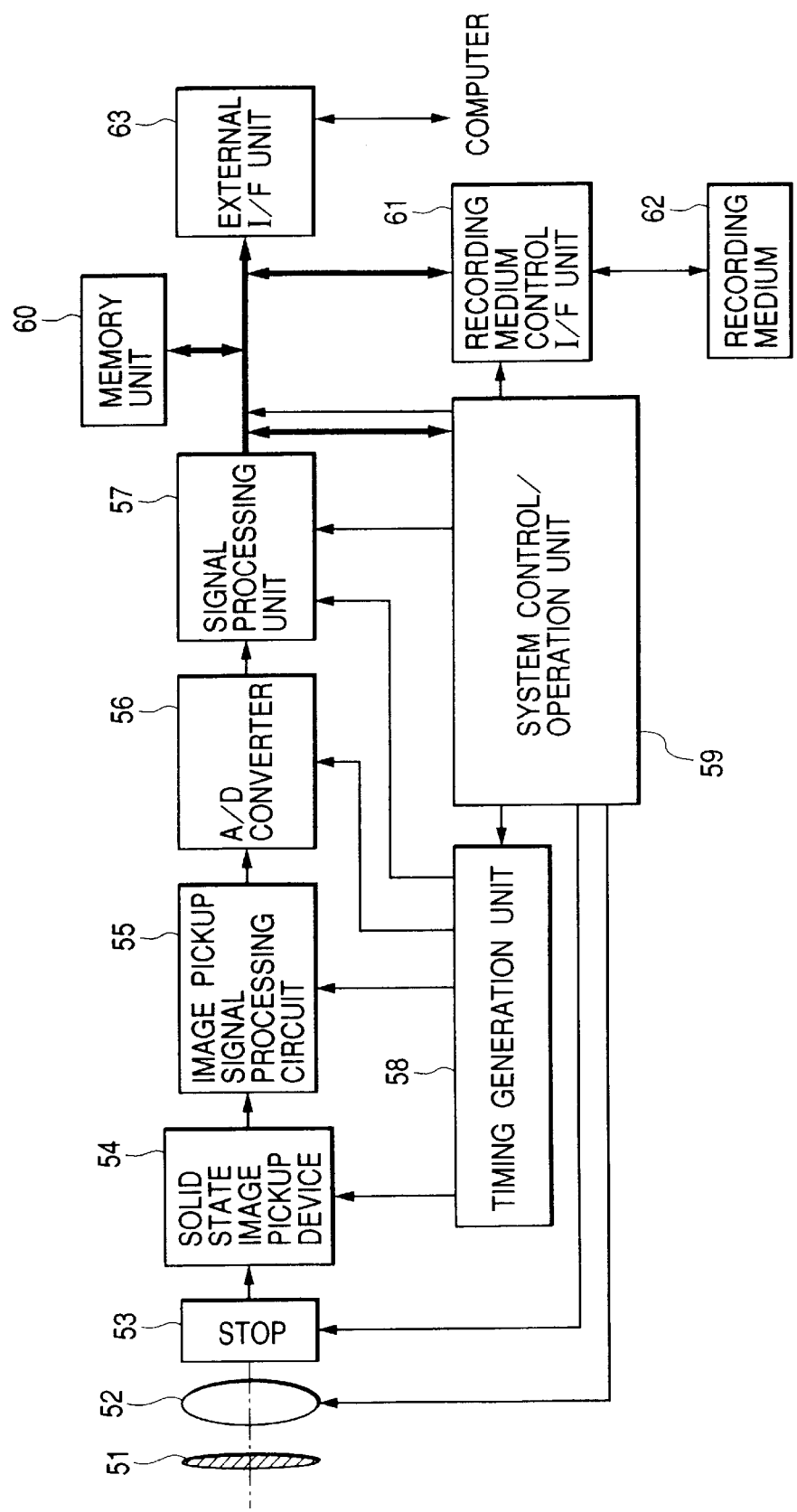
FIG. 9 is a schematic view showing the configuration of an image pickup device.
Figure 10:
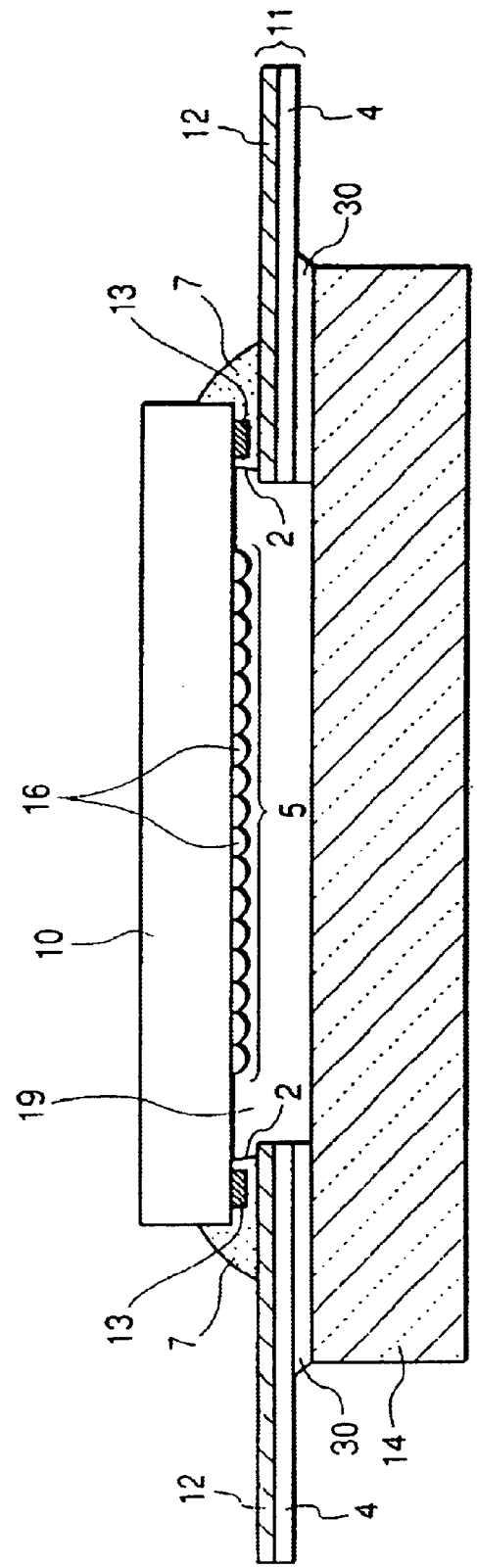
FIG. 10 is a schematic sectional view of a prior art image pickup device.
Figure 11:
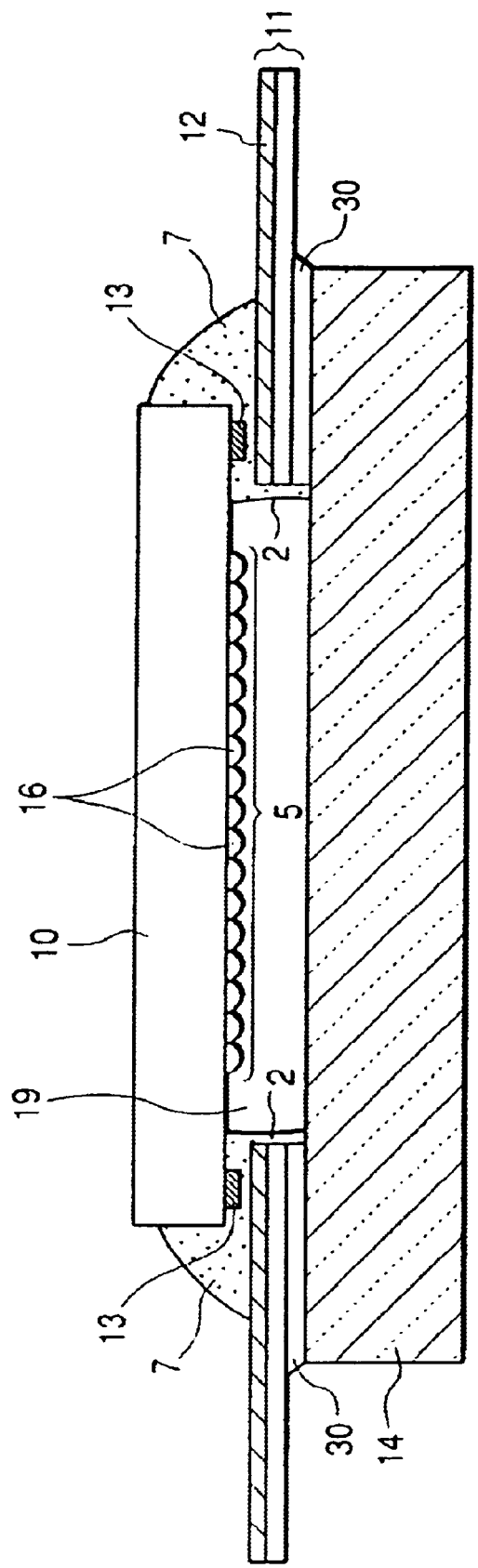
FIG. 11 is a schematic sectional view of a prior art image pickup device.

Referring to FIG. 9, an embodiment will be described specifically in the case where a solid state image pickup device according to the invention is applied to an imaging device such as a still camera.

In FIG. 9, reference numeral 51 denotes a barrier serving as both a protector and a main switch for a lens; reference numeral 52 denotes a lens for focusing an optical image of an object onto a solid state image pickup device 54; reference numeral 53 denotes a stop for varying the quantity of the light passing through the lens 52; reference numeral 56 denotes an A/D converter for analog-to-digital conversion of the image signal generated by the solid state image pickup device 54; reference numeral 57 denotes a signal processing unit for performing various corrections and data compression for the image data outputted by the A/D converter 56; reference numeral 58 denotes a timing generation unit for outputting various timing signals to the solid state image pickup device 54, an image pickup signal processing circuit 55, the A/D converter 56, and the signal processing unit 57; reference numeral 59 denotes a system control/operation unit for controlling various operations and the entirety of the image pickup device; reference numeral 60 denotes a memory for temporarily storing the image data; reference numeral 61 denotes an interface unit for recording into and reading from a recording medium; reference numeral 62 denotes a removable recording medium such as a semiconductor memory for recording and reading the image data; and reference numeral 63 denotes an interface unit for communicating with external computers or the like.

It will be described below how the image pickup device with above configuration operates during image pickup.

Upon opening of the barrier 51 a main power source is turned on, and a power source of the control system is then turned on, and a power source of the circuits for the image pickup system such as the A/D converter 56 and so on is then turned on. Subsequently, the system control/operation unit 59 opens the stop 53 in order to control the light exposure. A signal outputted by the solid state image pickup device 54 is converted by the A/D converter 56 and inputted into the signal processing unit 57.

Operation for exposure is performed by the system control/operation unit 59 based on the data. The brightness is determined based on the result of the photometry, and the stop is then controlled by the system control/operation unit 59 depending on the determination result.

Then, a high frequency component is taken out based on the signal outputted by the solid state image pickup element 54, and operation for the distance to the object is performed in the system control/operation unit 59. After that, whether focusing is attained or not is determined by driving the lens, and if it is determined that focusing is not attained, the ranging is then performed again by driving the lens. After confirming that focusing is attained, the main exposure is started.

After the exposure has been completed, the image signal outputted by the solid state image pickup device 54 is A/D converted in the A/D converter 56, and written into the memory unit via the signal processing unit 57 by the system control/operation unit 59.

After that, the data stored in the memory unit 60 pass through the recording medium control I/F unit 61 under control by the system control/operation unit 59, and then recorded into the removable recording medium 62 such as a semiconductor memory. Alternatively, the data may be inputted directly into a computer or the like for image processing, via the external I/F unit 63.

According to the invention, it is possible to suppress the disadvantage due to light reflected from beam leads.

Further, according to the invention, it is possible to improve the reliability of electronic parts and to provide electronic parts at a low cost.

What is claimed is:

1. An electronic device comprising a functional element chip having a photofunctional element formed thereon, a wiring member electrically connected to a terminal of the functional element chip, an encapsulant, which is formed of a photo-setting resin, provided so as to cover an electrical connecting portion for connecting the terminal of the functional element chip and the wiring member, and a light blocking member, with an opening portion, provided on a side opposite to the functional element chip side with regard to the wiring member,
   wherein an end portion of the light blocking member is located more toward a center of the functional element chip than is an inner end of the wiring member.

2. An electronic device comprising a semiconductor chip having an optical semiconductor element formed thereon, a wiring member electrically connected to a terminal of the semiconductor chip, an encapsulant provided so as to cover an electrical connecting portion for connecting the terminal of the semiconductor chip and the wiring member, a light-transmissive protective member and a light blocking member, with an opening portion, provided between a front face of the wiring member and a rear face of the protective member,
   wherein an end of the opening portion is located more inside than an inner end of the wiring member, and
   wherein the encapsulant is a photo-set resin, and the end of the opening portion and an inner end of the encapsulant align.

3. The electronic device according to claim 2, wherein the encapsulant is formed of a thermo-photo-setting resin.

4. The electronic device according to claim 2, wherein the encapsulant covers a conductive beam lead of the wiring member that is connected to the semiconductor chip such that the beam lead is not exposed.

5. The electronic device according to claim 2, wherein the encapsulant is an epoxy resin.

6. A camera comprising the electronic device set forth in claim 1 or 2 as a solid state image pick up device.

7. A process of producing an electronic device comprising a functional element chip with a terminal, a wiring member electrically connected to the terminal, an encapsulant for fixing the functional element chip and the wiring member, and a light-transmissive protective member, the process comprising the steps of:
   disposing a light blocking member with an opening portion between a front face of the wiring member and a rear face of the protective member such that an end of the opening portion is located more inside than an inner end of the wiring member;
   providing a photo-setting resin for forming the encapsulant onto the periphery of a connecting portion between the wiring member and the terminal of the functional element chip; and
   irradiating a light from the side of a front face of the protective member through the opening portion of the light blocking member to set at least a part of the photo-setting resin.

8. The process of producing an electronic device according to claim 7, wherein the photo-setting resin is a thermo-photo-setting resin, further comprising the step of heating the thermo-photo-setting resin after the step of irradiating the light.

* * * * *